(12) United States Patent
Park et al.

(10) Patent No.: US 12,308,255 B2
(45) Date of Patent: May 20, 2025

(54) APPARATUS AND METHOD FOR DRYING SUBSTRATE

(71) Applicant: Samsung Electronics Co., Ltd., Suwon-si (KR)

(72) Inventors: Sangjine Park, Suwon-si (KR); Jihoon Jeong, Seongnam-si (KR); Younghoo Kim, Yongin-si (KR); Kuntack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 470 days.

(21) Appl. No.: 17/582,620

(22) Filed: Jan. 24, 2022

(65) Prior Publication Data

US 2023/0010670 A1 Jan. 12, 2023

(30) Foreign Application Priority Data

Jul. 9, 2021 (KR) ........................ 10-2021-0090548

(51) Int. Cl.

| | |
|---|---|
| *F26B 5/00* | (2006.01) |
| *H01L 21/02* | (2006.01) |
| *H01L 21/67* | (2006.01) |
| *H01L 21/687* | (2006.01) |
| *H02J 50/12* | (2016.01) |
| *H05B 3/14* | (2006.01) |

(52) U.S. Cl.
CPC ........ *H01L 21/67034* (2013.01); *F26B 5/005* (2013.01); *H01L 21/02057* (2013.01); *H01L 21/67103* (2013.01); *H01L 21/67109* (2013.01); *H01L 21/67126* (2013.01); *H01L 21/6719* (2013.01); *H01L 21/67248* (2013.01); *H01L 21/68714* (2013.01); *H01L 21/68742* (2013.01); *H02J 50/12* (2016.02); *H05B 3/143* (2013.01); *H01L 21/02307* (2013.01)

(58) Field of Classification Search
None
See application file for complete search history.

(56) References Cited

U.S. PATENT DOCUMENTS

| | | | |
|---|---|---|---|
| 10,304,703 | B2 | 5/2019 | Gouk et al. |
| 11,410,862 | B2 | 8/2022 | Lee et al. |
| 2003/0084918 | A1 | 5/2003 | Kim |

(Continued)

FOREIGN PATENT DOCUMENTS

| | | |
|---|---|---|
| JP | 2004363404 A | 12/2004 |
| JP | 2007049065 A | 2/2007 |

(Continued)

*Primary Examiner* — Levon J Shahinian
(74) *Attorney, Agent, or Firm* — Myers Bigel, P.A.

(57) ABSTRACT

Provided is a substrate drying apparatus. The substrate drying apparatus may include an upper chamber body including an inlet configured to introduce a supercritical fluid into a chamber space, a lower chamber body including an outlet configured to discharge the supercritical fluid outside the chamber space, and a stage configured to be loaded with a wet substrate and arranged in the chamber space, wherein the upper chamber body and the lower chamber body are configured such that the chamber space is closed by bringing the upper chamber body into contact with the lower chamber body, and the chamber space is opened by separating the upper chamber body from the lower chamber body, and the stage comprises a heater configured to heat the substrate and the supercritical fluid.

20 Claims, 15 Drawing Sheets

(56) References Cited

U.S. PATENT DOCUMENTS

| | | |
|---|---|---|
| 2005/0217799 A1 | 10/2005 | Omeara et al. |
| 2019/0390344 A1 | 12/2019 | Mai et al. |
| 2020/0105574 A1 | 4/2020 | Morita et al. |
| 2021/0104418 A1 | 4/2021 | Park et al. |

FOREIGN PATENT DOCUMENTS

| | | |
|---|---|---|
| JP | 2011040572 A | 2/2011 |
| JP | 6085423 B2 | 2/2017 |
| KR | 20070008569 A | 1/2007 |
| KR | 10-1590906 | 1/2016 |
| KR | 20190125789 A | 11/2019 |
| KR | 20200095218 A | 8/2020 |

APPARATUS AND METHOD FOR DRYING SUBSTRATE

CROSS-REFERENCE TO RELATED APPLICATION

This application is based on and claims priority under 35 U.S.C. § 119 to Korean Patent Application No. 10-2021-0090548, filed on Jul. 9, 2021, in the Korean Intellectual Property Office, the disclosure of which is incorporated by reference herein in its entirety.

BACKGROUND

The inventive concept relates to an apparatus and method for drying a substrate. More particularly, the inventive concept relates to an apparatus and method for drying a substrate during an extreme ultraviolet (EUV) lithography process after a developing operation.

In accordance with demands for miniaturization of semiconductor devices, the EUV lithography method having a very short wavelength (about 13.5 nm) has been suggested. When the EUV lithography method is used, a photoresist pattern having a small horizontal dimension and a high aspect ratio (height/horizontal dimension) may be formed. In the related art, the substrate is rotated at a high speed to remove liquid remaining on the substrate after the developing operation. However, due to surface tension of the liquid, the photoresist pattern having a high aspect ratio may collapse. Therefore, alternatively, a method of removing the liquid remaining on the substrate by using supercritical fluid has been suggested.

SUMMARY

The inventive concept provides a substrate drying apparatus for a wafer to have a uniform temperature distribution for photoresist patterns to have uniform dimensions, and a substrate drying method.

According to an aspect of the inventive concept, there is provided a substrate drying apparatus including an upper chamber body including an inlet configured to introduce a supercritical fluid into a chamber space, a lower chamber body including an outlet configured to discharge the supercritical fluid outside the chamber space, and a stage in the chamber space and configured to receive a wet substrate, wherein the upper chamber body and the lower chamber body are configured such that the chamber space is closed by bringing the upper chamber body into contact with the lower chamber body, and the chamber space is opened by separating the upper chamber body from the lower chamber body, and the stage includes a heater configured to heat the substrate and the supercritical fluid.

According to another aspect of the inventive concept, there is provided a substrate drying apparatus including an upper chamber body including an inlet configured to introduce a supercritical fluid into a chamber space, a lower chamber body including an outlet configured to discharge the supercritical fluid outside the chamber space, a plurality of coupling units configured to bring the upper chamber body into contact with the lower chamber body, and a stage configured to be loaded with a wet substrate and arranged in the chamber space, wherein the stage includes an insulating structure and a heater, a heater controller, a battery, and a wireless charging module in the insulating structure, and a coating layer surrounding the insulating structure.

According to another aspect of the inventive concept, there is provided a method of drying a substrate, the method including loading a wet substrate on a stage, loading the stage on a lower chamber body, contacting the lower chamber body with an upper chamber body to close a chamber space defined by an upper chamber body and the lower chamber body, introducing a supercritical fluid into the chamber space via an inlet in the upper chamber body, heating the substrate and the supercritical fluid by using a heater in the stage, discharging the supercritical fluid outside the chamber space via an outlet in the lower chamber body, opening the chamber space such that the upper chamber body is separated from the lower chamber body, unloading the stage from the lower chamber body, and unloading the substrate from the stage.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
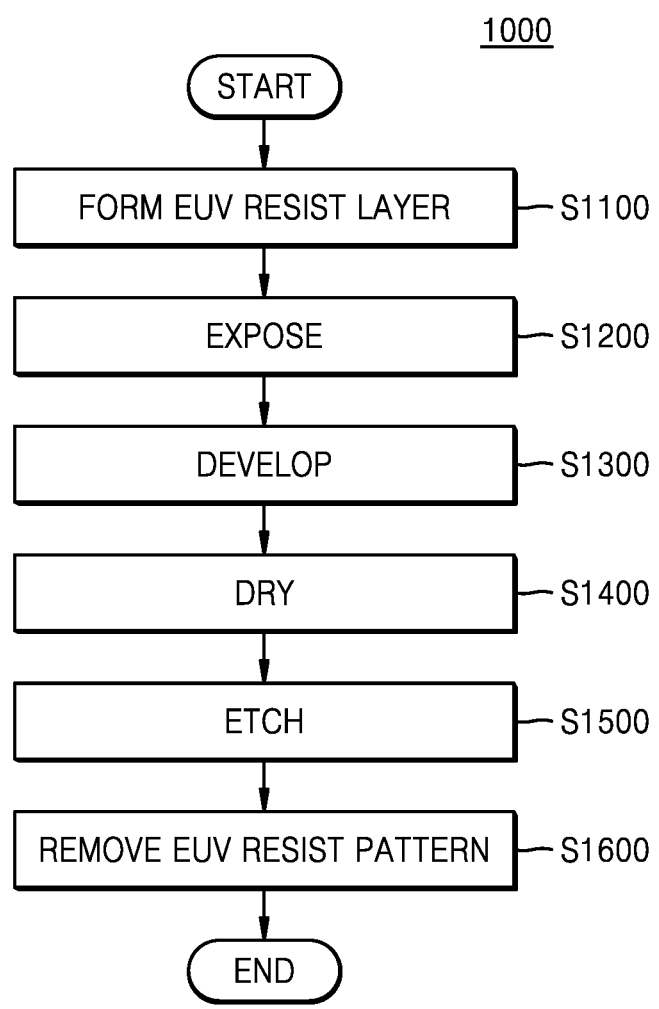
FIG. 1 is a flowchart illustrating an extreme ultraviolet (EUV) lithography operation according to an embodiment of the inventive concept.

FIG. 1 is a flowchart illustrating an extreme ultraviolet (EUV) lithography process 1000 according to an embodiment of the inventive concept. FIGS. 2A to 2F are cross-sectional views illustrating the EUV lithography process 1000 according to an embodiment of the inventive concept.

Figure 2A:
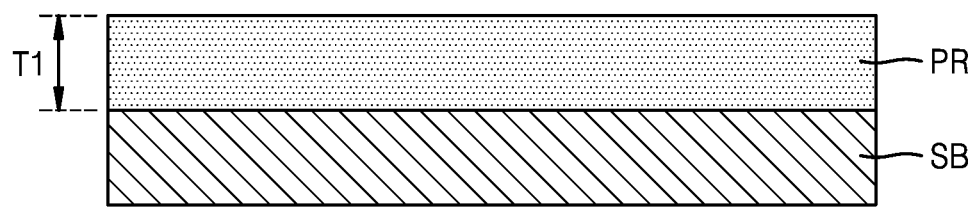
FIGS. 2A to 2F are cross-sectional views illustrating an EUV lithography process according to an embodiment of the inventive concept.

Referring to FIGS. 1 and 2A, an EUV resist layer PR may be formed on a substrate SB (S1100). For example, the EUV resist layer PR on the substrate SB may be formed by spin coating. Thereafter, prebaking may be performed to remove excess organic solvent and stabilize the EUV resist layer PR. The EUV resist layer PR may be sensitive to EUV light. In some embodiments, a thickness T1 of the EUV resist layer PR may be about 200 nm to about 600 nm, but a thicker or thinner EUV resist layer PR may be used.

In some embodiments, the EUV resist layer PR may include a polymer-based chemically amplified resist (CAR). In general, polymer-based CARs may include a backbone matrix polymer, a photoacid generator (PAG), and a dissolution inhibitor. The backbone matrix polymer may include poly(4-hydroxystyrene) (PHS), styrene derivatives, acrylate copolymers, or a combination thereof. Polymer-based CARs may further include non-metallic elements such as fluorine.

In some embodiments, the EUV resist layer PR may include a molecular glass resist. The molecular glass resist may include, for example, phenolic compounds, calixarene derivatives, or a combination thereof. In some embodiments, the EUV resist layer PR may include an inorganic-based resist. The inorganic base resist may include, for example, a $TiO_2$-based resist, a $ZrO_2$-based resist, a $Ta_2O_5$-based resist, an $HfO_2$-based resist, and the like.

Figure 2B:
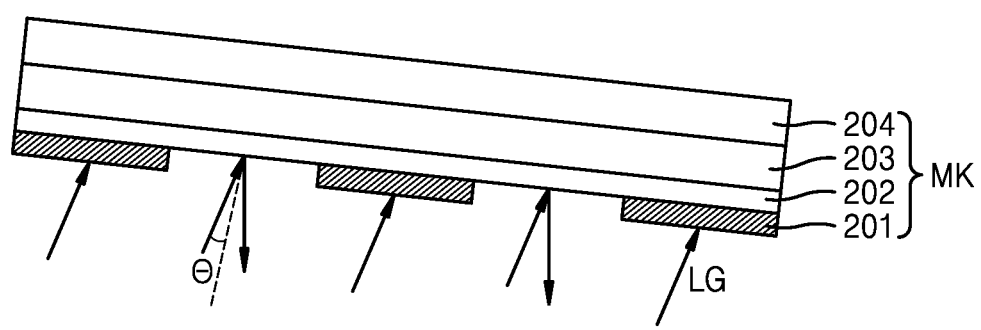
Figure 2B:
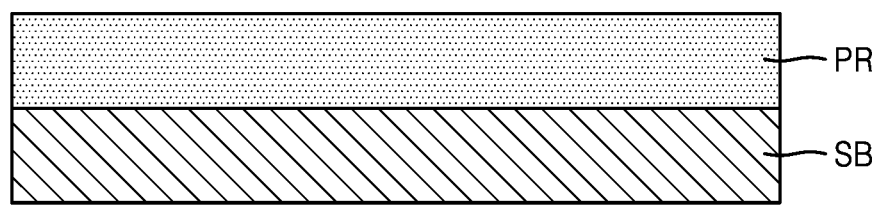

Referring to FIGS. 1 and 2B, a portion of the EUV resist layer PR may be exposed to EUV light LG. The EUV light LG may have a wavelength of about 13.5 nm. The mask MK may selectively reflect EUV light LG such that a portion of the EUV resist layer PR is selectively exposed to EUV light LG. Thereafter, post exposure baking may be performed.

The mask MK may include a silicon substrate 204. The mask MK may further include a multilayer 203 including a plurality of silicon layers stacked alternately with a plurality of molybdenum layers on the silicon substrate 204. In some embodiments, the thickness of each molybdenum layer may be different from the thickness of each silicon layer. The mask MK may further include a ruthenium layer 202 on the multilayer 203. The mask MK may further include layout patterns 201 on the ruthenium layer 202. The layout patterns 201 may include a tantalum boron nitride (TABN) layer and a lawrencium layer. Other materials and configurations of layers may be used in alternative masks MK. In addition, the mask MK may further include various layers.

EUV light LG generated from a light source may be incident on the mask MK in an oblique angle. The angle θ between EUV light LB incident on the mask MK and a direction perpendicular to the mask MK may be from about 5 degrees to about 7 degrees. The EUV light LG reflected by the mask MK may be incident on the EUV resist layer PR.

Figure 2C:
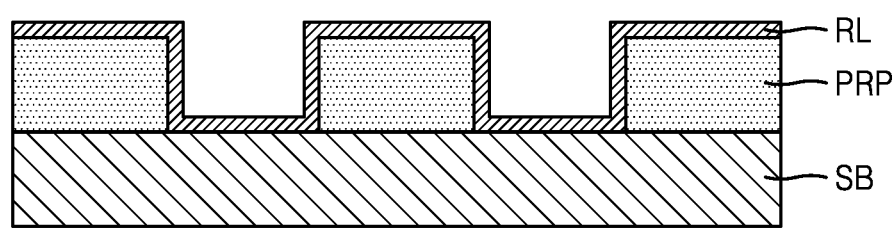

Referring to FIGS. 1, 2B, and 2C, an EUV resist pattern PRP may be formed by partially removing the EUV resist layer PR by using a developing solution (S1300). In some embodiments, when the EUV resist is a negative type, a portion of the EUV resist layer PR exposed to light may remain and a portion of the EUV resist layer PR not exposed to light may be removed. In other embodiments, when the EUV resist is a positive type, a portion of the EUV resist layer PR exposed to light may be removed and a portion of the EUV resist layer PR not exposed to light may remain. After developing, liquid RL may remain on the substrate SB and the EUV resist pattern PRP. The liquid RL may include a developing solution, water, and/or an organic solvent.

Figure 2D:
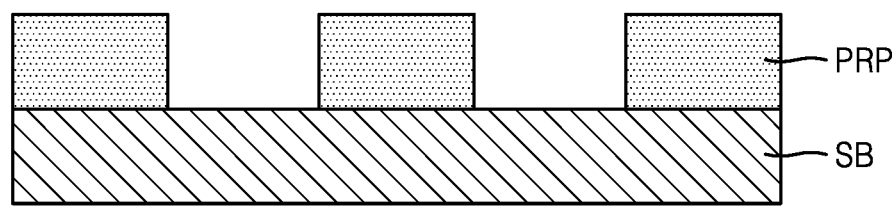

Referring to FIGS. 1, 2C, and 2D, the liquid RL may be removed from the substrate SB and the EUV resist pattern PRP. Thus, the substrate SB and the EUV resist pattern PRP may be dried (S1400). In the related art, a method of rotating the substrate SB at a high speed to remove liquid RL from the substrate SB and the EUV resist pattern PRP is used. However, the finer the EUV resist pattern PRP becomes, the EUV resist pattern PRP may collapse during rotation at a high speed because of surface tension caused by a high aspect ratio of the EUV resist pattern PRP.

In order to solve such a problem, a method of removing liquid RL by using a supercritical fluid has been suggested. By dissolving the liquid RL in the supercritical fluid and discharging the supercritical fluid, the liquid RL may be removed from the substrate SB and the EUV resist pattern PRP together with the supercritical fluid. A drying system using the supercritical fluid is described with reference to FIG. 3, a drying apparatus using the supercritical fluid is described with reference to FIG. 4, and a drying method using the supercritical fluid is described with reference to FIGS. 6 and 7A to 7G.

Figure 2E:
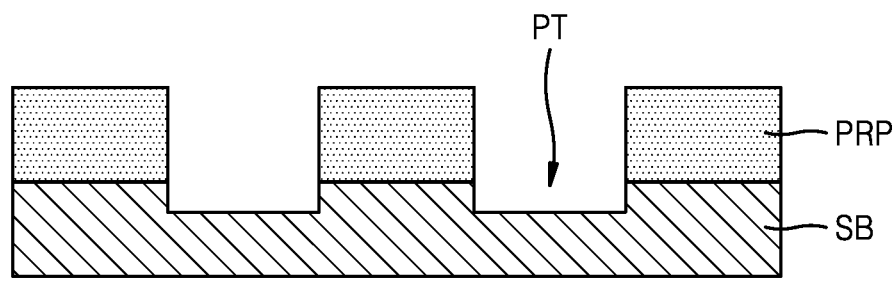

Referring to FIGS. 1 and 2E, by using the EUV resist pattern PRP as an etching mask, a layer below the EUV resist pattern PRP, for example, the substrate SB, may be etched (S1500). Accordingly, a pattern PT may be formed in the substrate SB. When a material layer is located between the EUV resist pattern PRP and the substrate SB, the pattern PT in the material layer may be formed by etching the material layer by using the EUV resist pattern PRP as the etching mask. Depending on the material to be etched, various etching methods such as wet etching or dry etching may be performed. A dry etching method may include, for example, reactive ion etching (RIE).

Figure 2F:
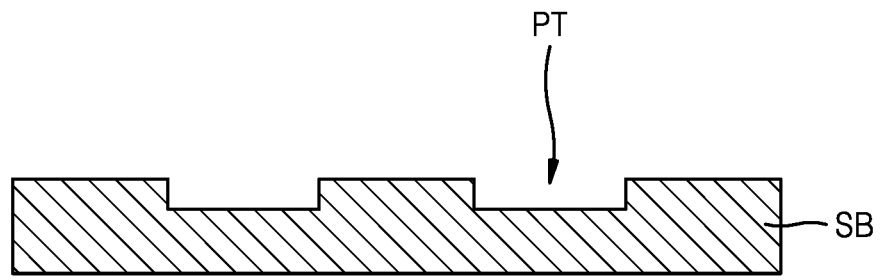

Referring to FIGS. 1, 2E, and 2F, the EUV resist pattern PRP may be removed from the substrate SB.

Figure 3:
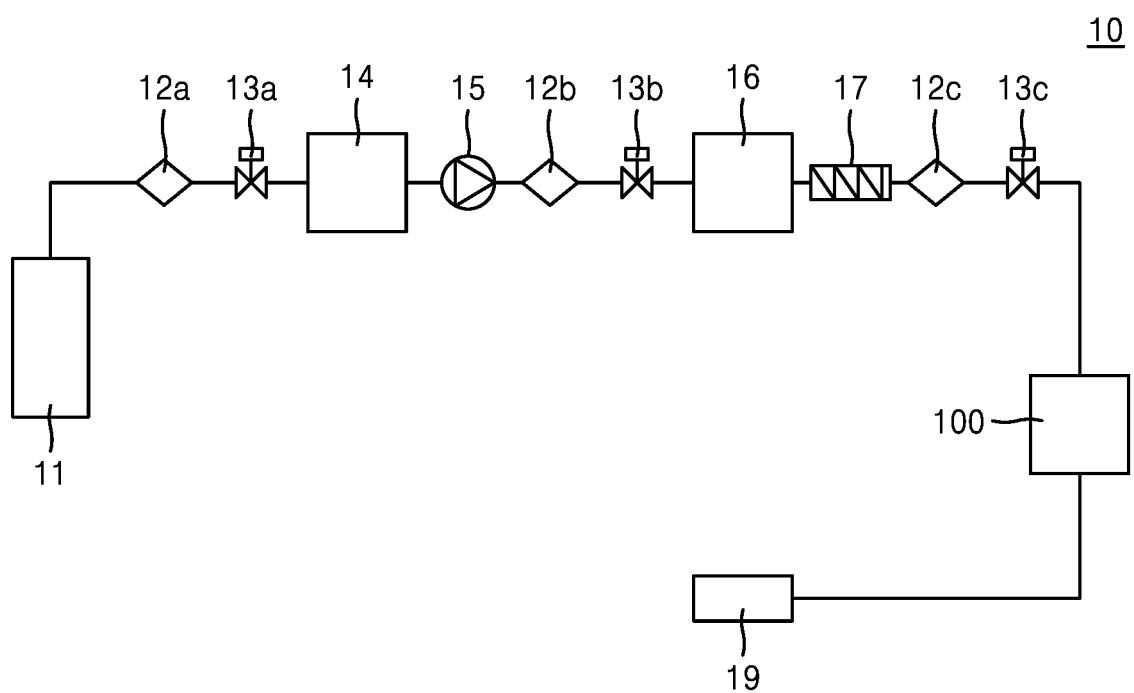
FIG. 3 is a conceptual diagram illustrating a substrate drying system according to an embodiment of the inventive concept.

FIG. 3 is a conceptual diagram illustrating a substrate drying system 10 according to an embodiment of the inventive concept.

Referring to FIG. 3, the substrate drying system 10 may include a liquid tank 11, a condenser 14, a pump 15, a storage tank 16, a heater 17, a substrate drying apparatus 100, and a discharging apparatus 19. The substrate drying system 10 may further include a plurality of filters, for example, first to third filters 12a to 12c, and a plurality of valves, for example, first to third valves 13a to 13c.

The liquid tank 11 may store liquid, for example, liquid carbon dioxide. The condenser 14 may convert supercritical fluid or gas into liquid and remove impurities therefrom. The pump 15 may convert liquid into supercritical fluid by applying pressure equal to or greater than supercritical pressure to the liquid. The storage tank 16 may store the supercritical fluid. The heater 17 may maintain a supercritical fluid state by heating the supercritical fluid to maintain a temperature of the supercritical fluid at a temperature equal to or greater than a critical temperature. The supercritical fluid may be supplied to the substrate drying apparatus 100. In the substrate drying apparatus 100, the supercritical fluid may dry the substrate. The supercritical fluid may dissolve the liquid on the substrate. The substrate drying apparatus 100 is described in more detail with reference to FIG. 4. The supercritical fluid in which liquid is dissolved may be discharged from the substrate drying apparatus 100 by the discharging apparatus 19.

The first to third filters 12a to 12c may remove impurities from the liquid or the supercritical fluid. Although FIG. 3 shows that the substrate drying system 10 includes three filters, for example, the first to third filters 12a to 12c, the substrate drying system 10 may include more or less than three filters.

The first to third valves 13a to 13c may control a flow of the liquid or the supercritical fluid. Although FIG. 3 shows that the substrate drying system 10 includes three valves, for example, the first to third valves 13a to 13c, the substrate drying system 10 may include more or less than three valves.

Figure 4:
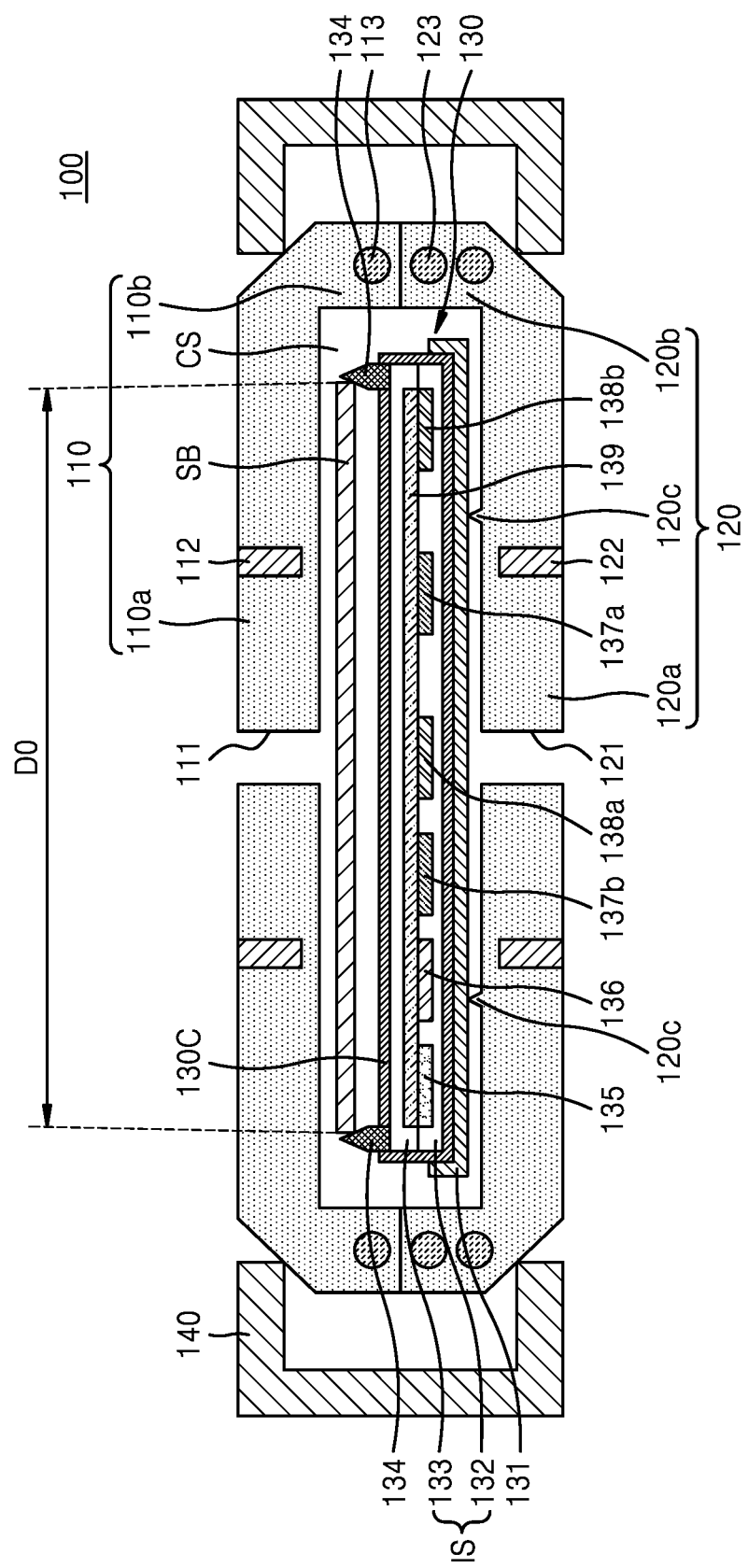
FIG. 4 is a cross-sectional view showing a substrate drying apparatus according to an embodiment of the inventive concept.
Figure 5A:
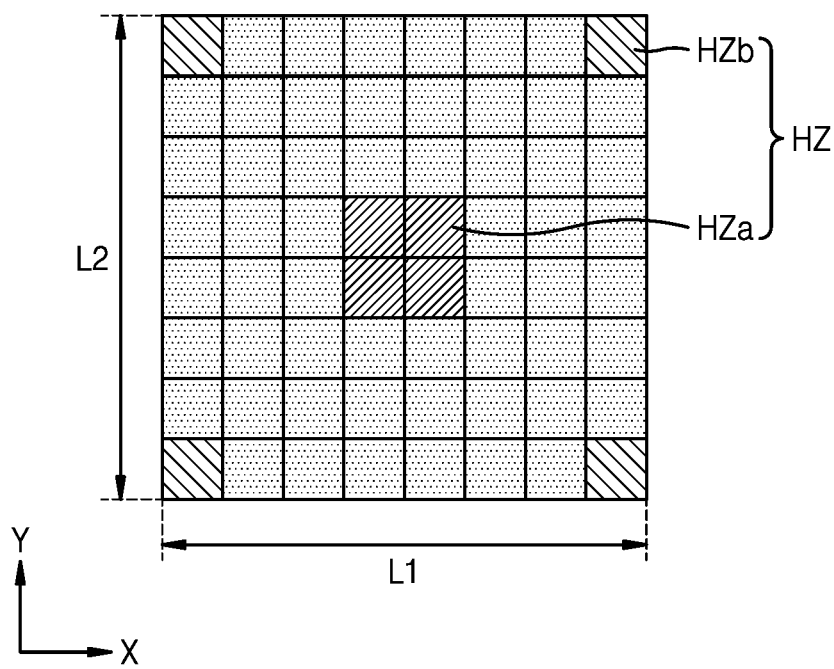
FIG. 5A is a plan view showing a heater according to an embodiment of the inventive concept.
Figure 5B:
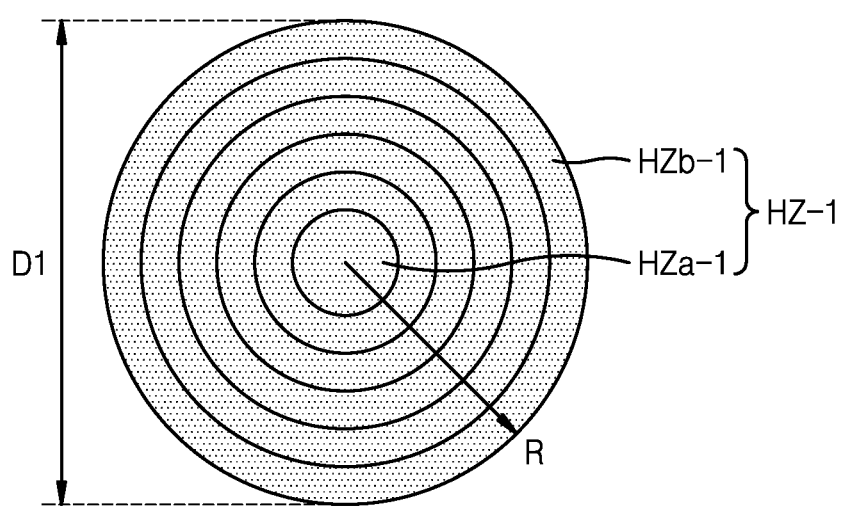
FIG. 5B is a plan view showing a heater according to an embodiment of the inventive concept.

FIG. 4 is a cross-sectional view showing a substrate drying apparatus 100 according to an embodiment of the inventive concept. FIG. 5A is a plan view showing a heater 139 according to an embodiment of the inventive concept. FIG. 5B is a plan view showing a heater 139-1 according to an embodiment of the inventive concept.

Referring to FIGS. 4, 5A, and 5B, the substrate drying apparatus 100 may include an upper chamber body 110, a lower chamber body 120, and a stage 130. The upper chamber body 110 may include an inlet 111 configured to introduce supercritical fluid into a chamber space CS. The upper chamber body 110 may include a ceiling 110a and an upper wall 110b extending from the ceiling 110a toward the lower chamber body 120. The inlet 111 may penetrate the ceiling 110a of the upper chamber body 110. In some embodiments, the upper chamber body 110 may include stainless steel. The supercritical fluid may include, for example, carbon dioxide in a supercritical fluid state.

The lower chamber body 120 may include an outlet 121 configured to discharge the supercritical fluid outside the chamber space CS. The lower chamber body 120 may include a floor 120a and a lower wall 120b extending from the floor 120a toward the upper chamber body 110. The outlet 121 may penetrate the floor 120a of the lower chamber body 120. In some embodiments, the lower chamber body 120 may include stainless steel.

The upper chamber body 110 and the lower chamber body 120 may be configured such that the chamber space CS is closed by bringing the upper chamber body 110 into contact with the lower chamber body 120, and the chamber space CS is opened by separating the upper chamber body 110 from the lower chamber body 120. That is, the upper chamber body 110 and the lower chamber body 120 may form an open-type chamber body. The upper wall 110b of the upper chamber body 110 and the lower wall 120b of the lower chamber body 120 may be in contact with each other.

The substrate drying apparatus 100 may be configured such that a pressure and a temperature in the chamber space CS are equal to or greater than a critical pressure and a critical temperature of the supercritical fluid, respectively. For example, the critical pressure of carbon dioxide may be about 74 bar and the critical temperature thereof may be about 31° C. The temperature in the chamber space CS may be, for example, about 31° C. to about 100° C., and the pressure in the chamber space CS may be about 74 bar to about 100 bar.

The stage 130 may be loaded with the substrate SB and arranged in the chamber space CS. The stage 130 may include the substrate SB and the heater 139 configured to heat the supercritical fluid. The stage 130 may further include a heater controller 137a for controlling the heater 139.

In some embodiments, as shown in FIG. 5A, the heater 139 may include a plurality of heating zones HZ arranged in a first direction (X direction) and a second direction (Y direction), wherein the first direction and the second direction intersect each other. In some embodiments, the first direction (X direction) and the second direction (Y direction) may be perpendicular to each other. Although FIG. 5A shows that the heater 139 includes 64 heating zones HZ, the number of heating zones HZ that the heater 139 may include may be greater than or less than 64. In some embodiments, for uniform heating, a dimension L1 in the first direction (X direction) of the heater 139 and a dimension L2 in the second direction (Y direction) of the heater 139 may each be greater than a diameter D0 of the substrate SB. For example, when the diameter D0 of the substrate SB is 300 mm, the dimension L1 in the first direction (X direction) of the heater 139 (X direction) and the dimension L2 in the second direction (Y direction) of the heater 139 may each be 300 mm or more.

The heater controller 137a may independently control the plurality of heating zones HZ. The heater controller 137a may independently control a voltage or current that is transferred to the plurality of heating zones HZ. The heater controller 137a may control the plurality of heating zones HZ so that the substrate SB has a uniform temperature across the substrate SB. According to a simulation result, when uniform power is provided to the plurality of heating zones HZ, a temperature in the center of the substrate SB is lower than a temperature in the outermost portion of the substrate SB. Accordingly, the heater controller 137a may control central heating zones HZa and outermost heating zones HZb among the plurality of heating zones HZ such that power consumed by the central heating zones HZa is greater than power consumed by the outermost heating zones HZb.

As used herein, the central heating zones HZa refer to the closest ones to the center of the heater 139 among the plurality of heating zones HZ, and the outermost heating zones HZb refer to the farthest ones from the center of the heater 139 among the plurality of heating zones HZ. When the heater 139 includes $2n$ (n is a natural number) heating zones HZ in the first direction (X direction) and $2n$ heating zones HZ in the second direction (Y direction), the central heating zones HZa may refer to the heating zones HZ having coordinates of $(n, n)$, $(n, n+1)$, $(n+1, n)$, or $(n+1, n+1)$ in the first direction (X direction) and the second direction (Y direction). The outermost heating zones HZb may refer to the heating zones HZ having coordinates of $(2n, 1)$, $(1, 1)$, $(1, 2n)$, or $(2n, 2n)$ in the first direction (X direction) and the second direction (Y direction). When the heater 139 includes $2n+1$ (n is a natural number) heating zones HZ in the first direction (X direction) and $2n+1$ heating zones HZ in the second direction (Y direction), the central heating zone HZa may refer to the heating zones HZ having coordinates of $(n+1, n+1)$ in the first direction (X direction) and the second direction (Y direction). The outermost heating zone HZb may refer to the heating zones HZ having coordinates of $(2n+1, 1)$, $(1, 1)$, $(1, 2n+1)$, or $(2n+1, 2n+1)$ in the first direction (X direction) and the second direction (Y direction).

In some embodiments, as shown in FIG. 5B, the heater 139-1 may include a plurality of heating zones HZ-1 arranged in a radial direction (R direction) of the heater. Although FIG. 5B shows that the heater 139-1 includes six heating zones HZ-1, the number of heating zones HZ-1 that the heater 139-1 may include may be greater than or less than six. In some embodiments, for uniform heating, a diameter D1 of the heater 139-1 may be greater than the diameter D0 of the substrate SB. For example, when the diameter D0 of the substrate SB is 300 mm, the diameter D1 of the heater 139-1 may be 300 mm or more. A central heating zone HZa-1 among the plurality of heating zones HZ-1 may be circular. The remaining heating zones HZ-1 may have a shape of a ring having the same center as the central heating zone HZa-1.

The heater controller 137a may independently control the plurality of heating zones HZ-1. The heater controller 137a may independently control voltage or current that is transferred to the plurality of heating zones HZ-1. The heater controller 137a may control the plurality of heating zones HZ-1 so that the substrate SB has a uniform temperature across the substrate SB. According to the simulation result, when uniform power is provided to the plurality of heating zones HZ-1, the temperature in the center of the substrate SB is lower than the temperature in the outermost portion of the substrate SB. Accordingly, the heater controller 137a may control the central heating zone HZa-1 and an outermost heating zone HZb-1 among the plurality of heating zones HZ-1 such that power consumed by the central heating zone HZa-1 is greater than power consumed by the outermost heating zone HZb-1.

The heaters 139 and 139-1 may heat the substrate SB so that the substrate SB has a relatively uniform temperature across the substrate SB. Therefore, a difference in the dimension of the EUV resist pattern caused by a change in the temperature of the substrate SB may be reduced.

The stage 130 may further include a battery 135 for supplying power to the heaters 139 and 139-1 and a wireless charging module 136 for wirelessly charging the battery 135. Therefore, power may be supplied to the heater 139 without complicated wiring for connecting the heater 139 to a power source. The battery 135 may include a lithium ion battery in some embodiments. The wireless charging module 136 may be inductive or resonant.

The stage 130 may further include temperature sensors, for example, first and second temperature sensors 138a and 138b. The heater controller 137a may control the heaters 139 and 139-1 according to the temperature sensor, for example, the first and second temperature sensors 138a and 138b. For example, the first temperature sensor 138a may be disposed under the central heating zones HZa and HZa-1 and the second temperature sensor 138b may be disposed under the outermost heating zones HZb and HZb-1. The heater controller 137a may control the heaters 139 and 139-1 such that a difference between a first temperature of the first temperature sensor 138a and a second temperature of the second temperature sensor 138b is reduced. The heater controller 137a may control the heaters 139 and 139-1 such that a difference between a first temperature of the first temperature sensor 138a and a second temperature of the second temperature sensor 138b is within a certain range.

The number and arrangement of the temperature sensors may vary. In some embodiments, the stage 130 may include only one temperature sensor. The heater controller 137a may control the heaters 139 and 139-1 such that the temperature of the temperature sensor is within a certain range.

In another embodiment, the stage 130 may include a number of temperature sensors corresponding to the number of heating zones HZ and HZ-1. The heater controller 137a may control the plurality of heating zones HZa-1 and HZb-1 to reduce the difference between the temperatures of the plurality of temperature sensors. The heater controller 137a may control the heaters 139 and 139-1 such that the temperature of each temperature sensor is within a certain range.

In some embodiments, the stage 130 may further include a controller 137b for controlling an entire circuit including the heaters 139 and 139-1, the battery 135, the wireless charging module 136, the first and second temperature sensors 138a and 138b, and the heater controller 137a. For example, the controller 137b may turn on the wireless charging module 136 to charge the battery 135, and turn off the heaters 139 and 139-1. Also, the controller 137b may turn off the wireless charging module 136, and turn on the heaters 139 and 139-1.

The stage 130 may include a first insulating layer 133 and a second insulating layer 132 under the first insulating layer 133. The first insulating layer 133 and the second insulating layer 132 may form an insulating structure IS. The first insulating layer 133 may cover the heater 139. The second insulating layer 132 may cover at least one of the battery 135, the wireless charging module 136, the heater controller 137a, the controller 137b, and the first and second temperature sensors 138a and 138b. Thus, the heater 139 may be located in the insulating structure IS. At least one of the battery 135, the wireless charging module 136, the heater controller 137a, the controller 137b, and the first and second temperature sensors 138a and 138b may be located in the insulating structure IS. Thus, the heater 139 may be surrounded by the insulating structure IS. At least one of the battery 135, the wireless charging module 136, the heater controller 137a, the controller 137b, and the first and second temperature sensors 138a and 138b may be surrounded by the insulating structure IS.

The first insulating layer 133 and the second insulating layer 132 may include, for example, polyether ether ketone (PEEK), polyimide (PI), or polytetrafluoroethylene (PTFE).

The stage 130 may further include a coating layer 130C covering the insulating structure IS. That is, the coating layer 130C may surround the insulating structure IS. The coating layer 130C may include a material which withstands high temperature and high pressure in the chamber space CS. The coating layer 130C may include, for example, PTFE.

In some embodiments, the stage 130 may further include a filler 131 filling a portion of the chamber space CS between the lower chamber body 120 and the second insulating layer 132. The filler 131 may cause the pressure in the chamber space CS to quickly reach the critical pressure by reducing a volume of the chamber space CS that the supercritical fluid needs to fill. The filler 131 may include, for example, stainless steel.

The substrate drying apparatus 100 may further include a first lower heater 122 in the floor 120a of the lower chamber body 120 and a second lower heater 123 in the lower wall 120b of the lower chamber body 120. In some embodiments, the first lower heater 122 may have a bar shape. In some embodiments, the second lower heater 123 may be ring-shaped or coil-shaped and may surround the chamber space CS.

The substrate drying apparatus 100 may further include a first upper heater 112 in the ceiling 110a of the upper chamber body 110 and a second upper heater 113 in the upper wall 110b of the upper chamber body 110. In some embodiments, the first upper heater 112 may have a bar shape. In some embodiments, the second upper heater 113 may be ring-shaped or coil-shaped and may surround the chamber space CS.

In some embodiments, the lower chamber body 120 may further include one or more supporting structures, such as one or more pins 120c protruding from the upper surface of the floor 120a toward the stage 130. The stage 130 may be loaded on the pins 120c. In some embodiments, the stage 130 may further include one or more supporting structures, such as one or more substrate pins 134 on the first insulating layer 133. The substrate SB may be loaded on the substrate pins 134.

In some embodiments, the substrate drying apparatus 100 may further include a plurality of coupling units 140 configured to bring the upper chamber body 110 into contact with the lower chamber body 120. The coupling units 140 may bring the upper wall 110b of the upper chamber body 110 into contact with the lower wall 120b of the lower chamber body 120. The coupling units 140 may contact inclined portions of the upper chamber body 110 and the lower chamber body 120, respectively. By applying force to the coupling units 140 in a horizontal direction toward the center portion of the substrate drying apparatus 100, force may be applied downwards and upwards to the upper chamber body 110 and the lower chamber body 120, respectively. Thus, the upper chamber body 110 and the lower chamber body 120 may be in stronger contact with each other.

Figure 6:
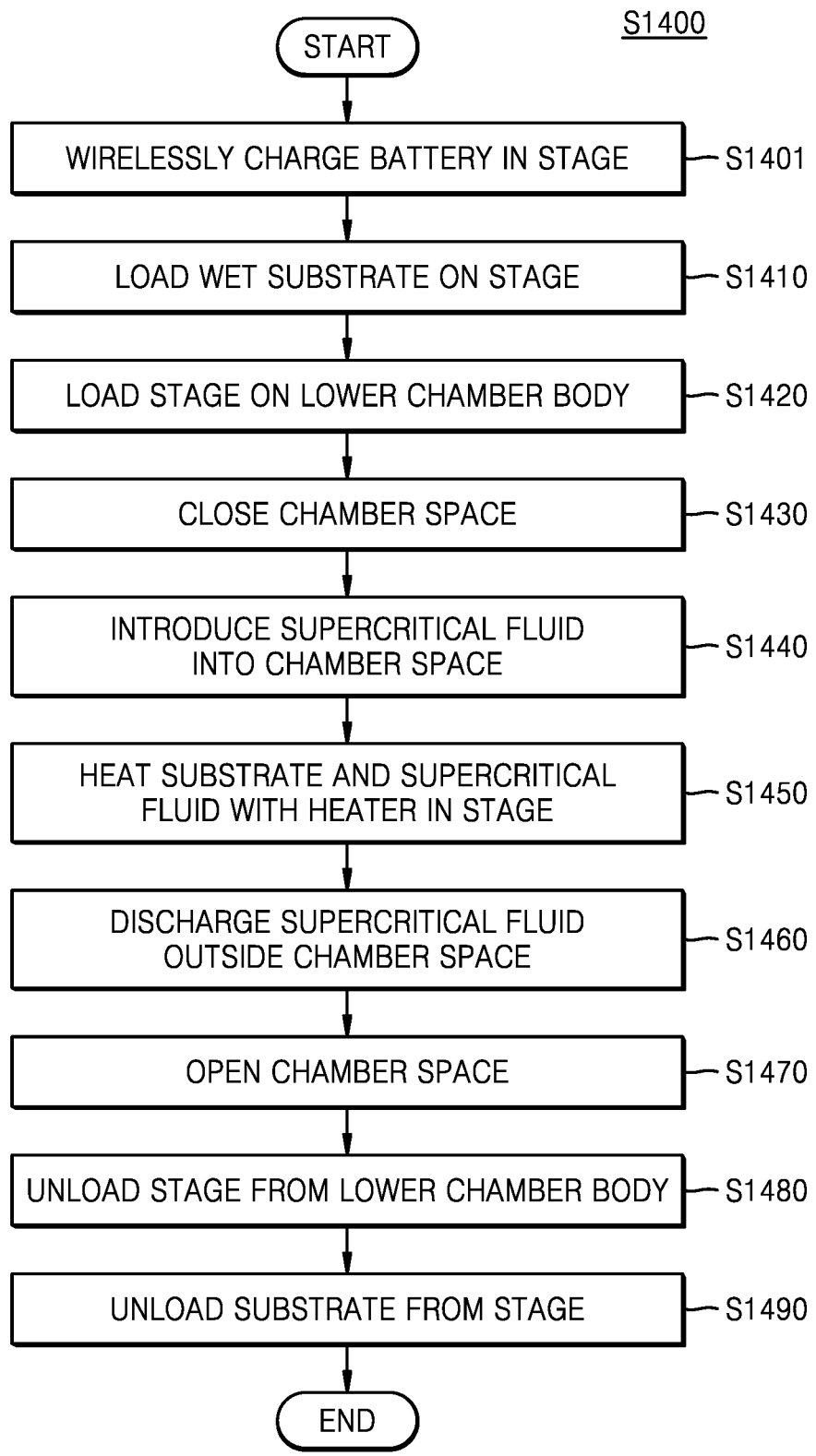
FIG. 6 is a flowchart illustrating a substrate drying method according to an embodiment of the inventive concept.

FIG. 6 is a flowchart illustrating a substrate drying method S1400 according to an embodiment of the inventive concept. FIGS. 7A to 7I are cross-sectional views illustrating the substrate drying method S1400 according to an embodiment of the inventive concept.

Figure 7A:
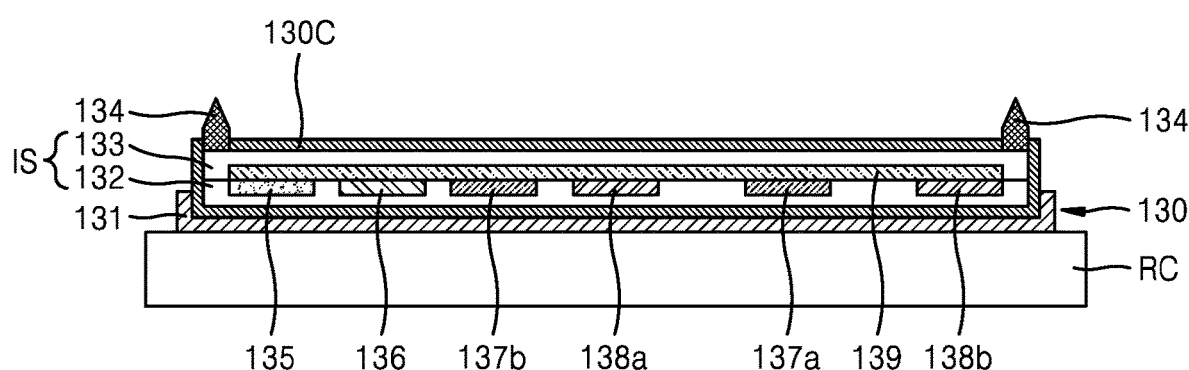
FIGS. 7A to 7I are cross-sectional views illustrating a substrate drying method according to an embodiment of the inventive concept.

Referring to FIGS. 6 and 7A, the battery 135 in the stage 130 may be wirelessly charged (S1401). The stage 130 may be disposed adjacent to the wireless charger RC to wirelessly charge the battery 135. For example, the battery 135 may be placed on the wireless charger RC. However, the stage 130 may not necessarily contact the wireless charger RC. For example, the stage 130 may be separated from the wireless charger RC. The battery 135 may be wirelessly charged using the wireless charging module 136 in the stage 130. Because the battery 135 in the stage 130 is wirelessly charged, a complex wiring for providing power to the stage 130 may be unnecessary. In some embodiments, operation S1401 of wirelessly charging the battery 135 may be performed at the end of the substrate drying method S1400. That is, operation S1401 of wirelessly charging the battery 135 may be performed after operation S1490 of unloading the substrate SB from the stage 130.

Figure 7B:
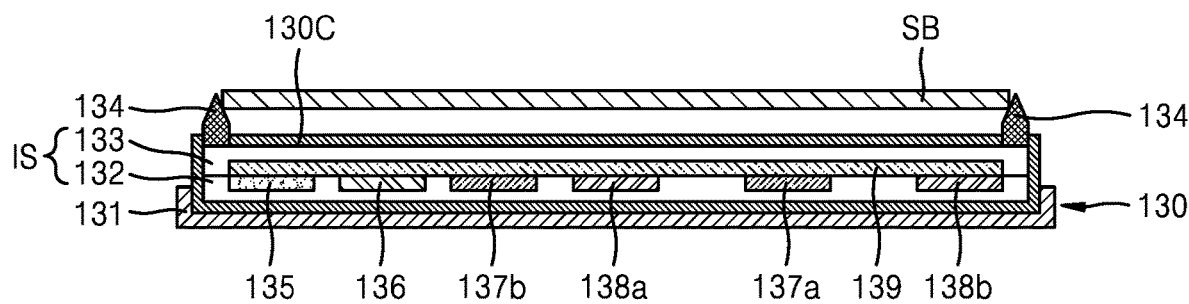

Referring to FIGS. 6 and 7B, a wet substrate SB may be loaded on the stage 130 (S1410). The wet substrate SB may be a substrate SB that underwent a developing operation. A liquid, such as a developing solution, water, and an organic solvent, etc. may remain on the substrate SB. The substrate SB may be loaded on the substrate pins 134 of the stage 130.

Figure 7C:
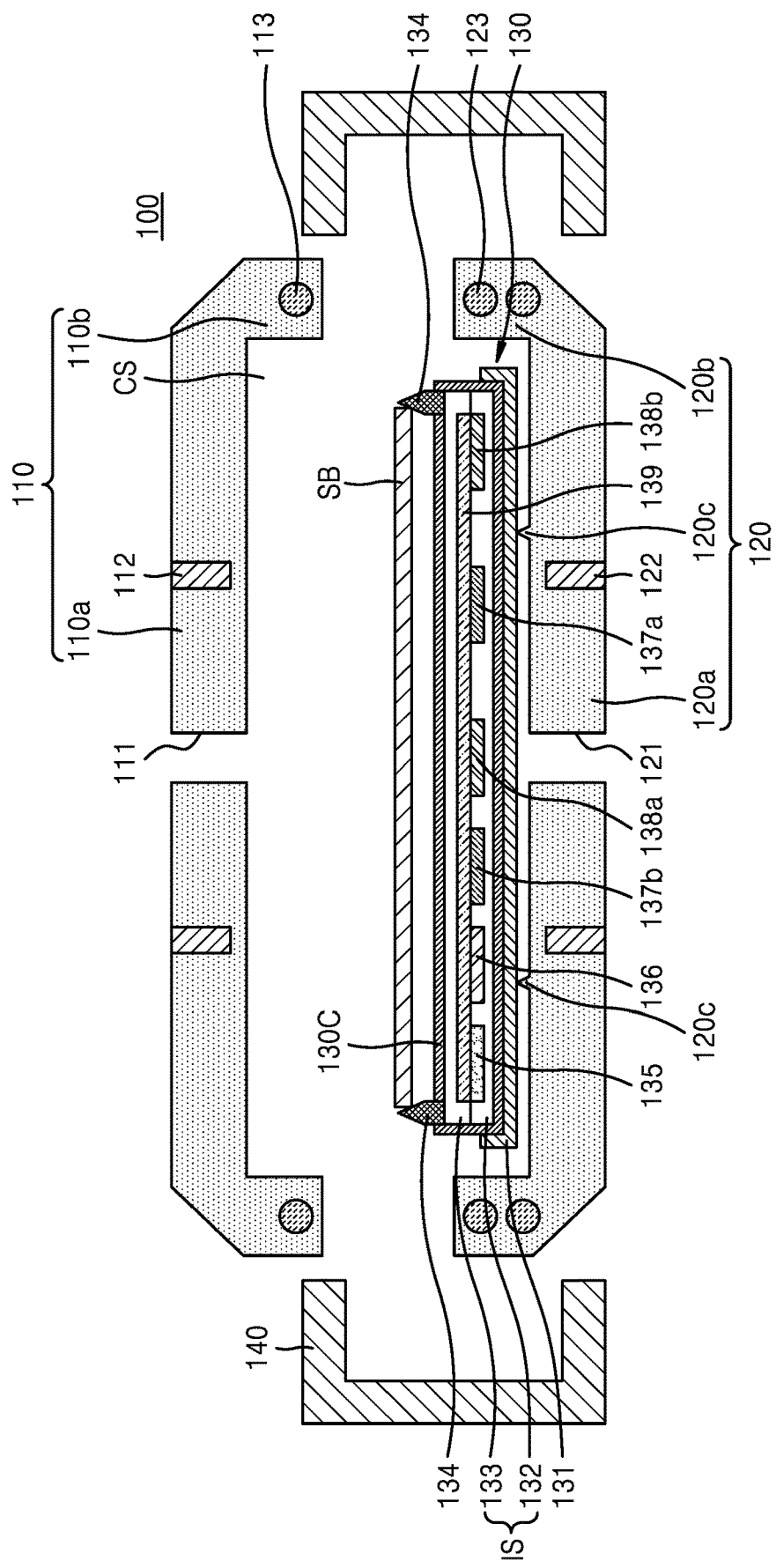

Referring to FIGS. 6 and 7C, the stage 130 may be loaded on the lower chamber body 120 (S1420). For example, the stage 130 may be loaded on the pins 120c of the lower chamber body 120.

Figure 7D:
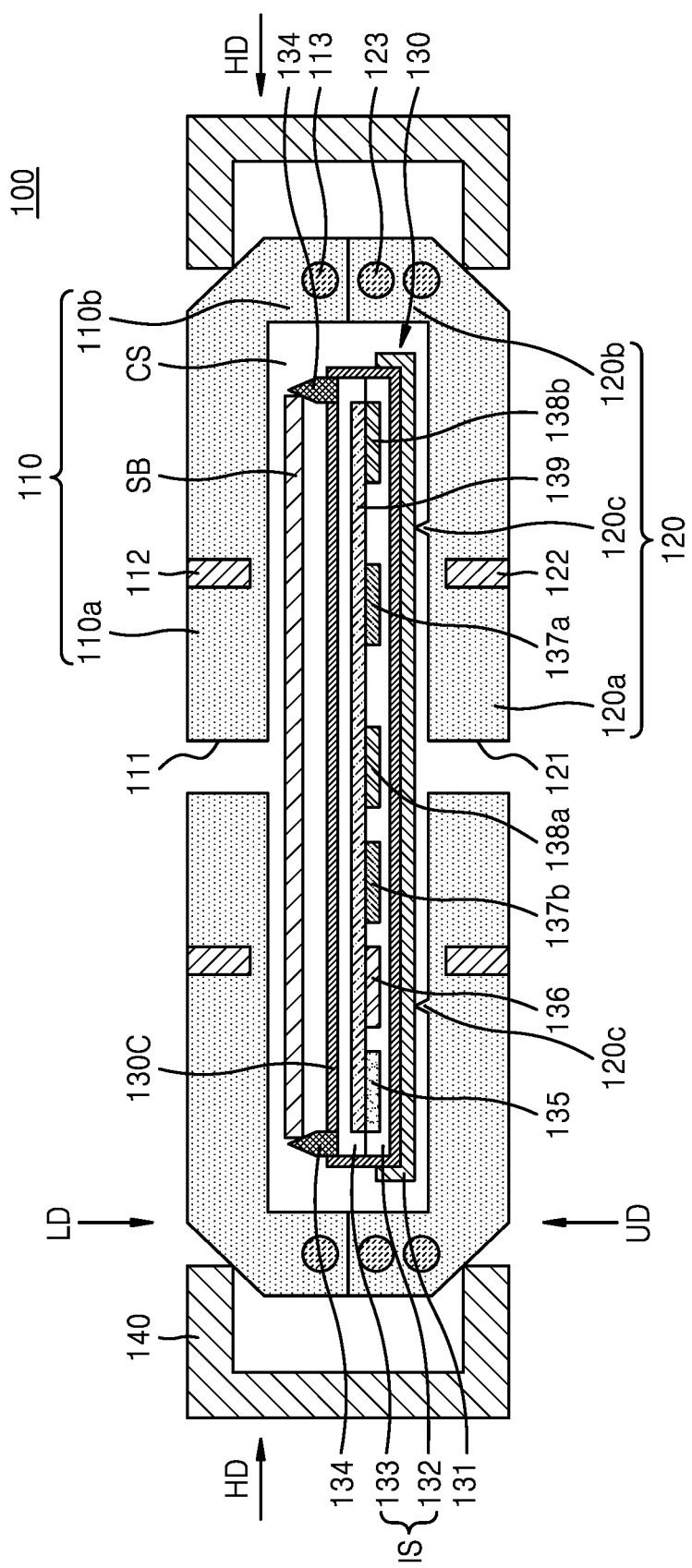

Referring to FIGS. 6 and 7D, the chamber space CS may be closed (S1430). For example, the chamber space CS defined by the upper chamber body 110 and the lower chamber body 120 may be closed such that the upper chamber body 110 contacts the lower chamber body 120. The upper wall 110b of the upper chamber body 110 may contact the lower wall 120b of the lower chamber body 120. In some embodiments, each coupling unit 140 may additionally contact the inclined portions of the upper chamber body 110 and the lower chamber body 120, respectively. By moving the coupling units 140 in a horizontal direction toward the center portion of the substrate drying apparatus 100, force may be applied downwards LD and upwards UD to the upper chamber body 110 and the lower chamber body 120, respectively. Thus, the upper chamber body 110 may contact the lower chamber body 120 to close the chamber space CS.

Figure 7E:
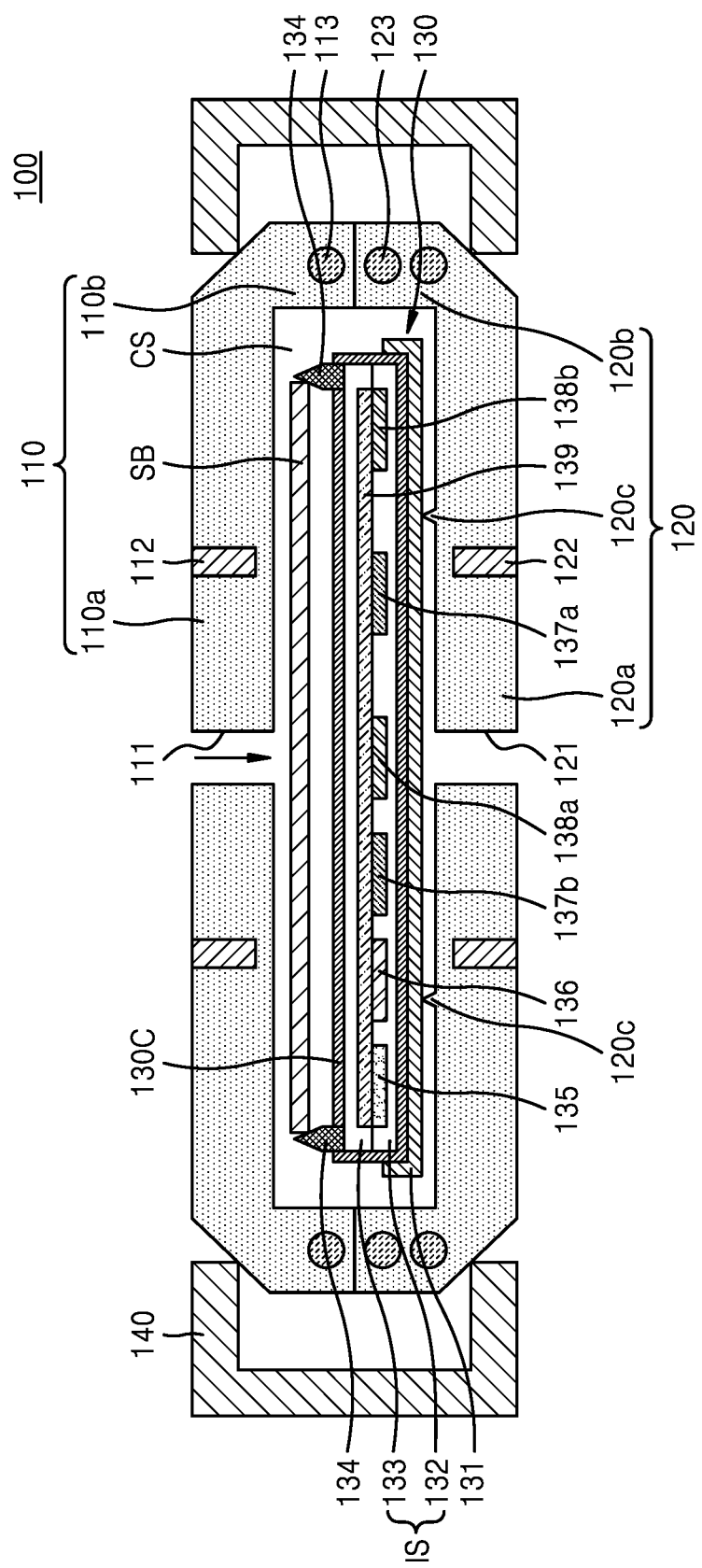

Referring to FIGS. 6 and 7E, supercritical fluid may be introduced into the chamber space CS S1440. The supercritical fluid may be introduced into the chamber space CS via the inlet 111 penetrating the ceiling 110a of the upper chamber body 110. In addition, the substrate SB and the supercritical fluid may be heated by the heater 139 in the stage 130 (S1450). In some embodiments, operation S1440 of introducing the supercritical fluid into the chamber space CS may be performed simultaneously with a heating operation S1450 or the heating operation S1450 may be performed before operation S1440 of introducing the supercritical fluid into the chamber space CS. In some embodiments, operation S1440 of introducing the supercritical fluid into the chamber space CS and a heating operation S1450 may be proceeded sequentially. Operation S1440 of introducing the supercritical fluid into the chamber space CS and the heating operation S1450 may cause the pressure and temperature in the chamber space CS to be greater than or equal to the critical pressure and critical temperature of the supercritical fluid. For example, the critical pressure of carbon dioxide may be about 74 bar and the critical temperature thereof may be about 31° C. The temperature in the chamber space CS may be, for example, about 31° C. to about 100° C., and the pressure in the chamber space CS may be about 74 bar to about 100 bar.

In some embodiments, in addition to the heater 139 in the stage 130, at least one of the first upper heater 112 in the ceiling 110a of the upper chamber body 110, the second upper heater 113 in the upper wall 110b of the upper chamber body 110, the first lower heater 122 in the floor 120a of the lower chamber body 120, and the second lower heater 123 in the lower wall 120b of the lower chamber body 120 may be used to heat the substrate SB and the supercritical fluid.

As shown in FIG. 5A, the heater 139 may include a plurality of heating zones HZ arranged in a first direction (X direction) and a second direction (Y direction), wherein the first direction and the second direction intersect each other, for example, are perpendicular to each other. The heater controller 137a may independently control the plurality of heating zones HZ. The heater controller 137a may independently control a voltage or a current that is transferred to the plurality of heating zones HZ. The heater controller 137a may control the plurality of heating zones HZ so that the substrate SB has a uniform temperature across the substrate SB. For example, the heater controller 137a may control the central heating zones HZa and the outermost heating zones HZb among the plurality of heating zones HZ such that power consumed by the central heating zones HZa is greater than power consumed by the outermost heating zones HZb.

In some embodiments, as shown in FIG. 5B, the heater 139-1 may include a plurality of heating zones HZ-1 arranged in a radial direction (R direction) thereof. The heater controller 137a may independently control the plurality of heating zones HZ-1. The heater controller 137a may independently control the voltage or the current that is transferred to the plurality of heating zones HZ-1. The heater controller 137a may control the plurality of heating zones HZ-1 so that the substrate SB has a uniform temperature across the substrate SB. For example, the heater controller 137a may control the central heating zone HZa-1 and the outermost heating zone HZb-1 among the plurality of heating zones HZ-1 such that power consumed by the central heating zone HZa-1 is greater than power consumed by the outermost heating zone HZb-1.

Figure 7F:
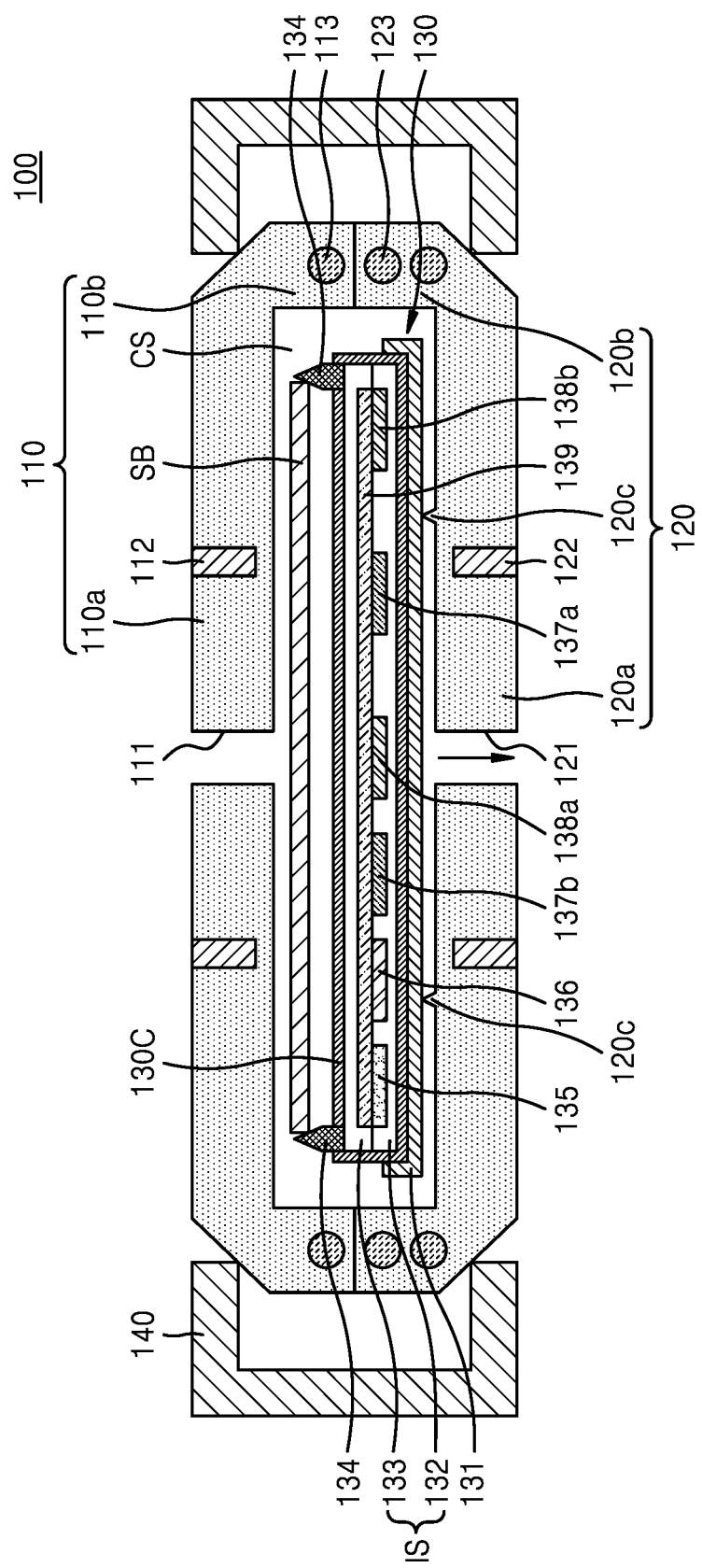

Referring to FIGS. 6 and 7F, the supercritical fluid may be discharged outside the chamber space CS (S1460). After the supercritical fluid dissolves liquid on the substrate SB, the supercritical fluid may be discharged outside the chamber space CS together with the liquid on the substrate SB. For example, the supercritical fluid may be discharged outside the chamber space CS via the outlet 121 penetrating the floor 120a of the lower chamber body 120.

Figure 7G:
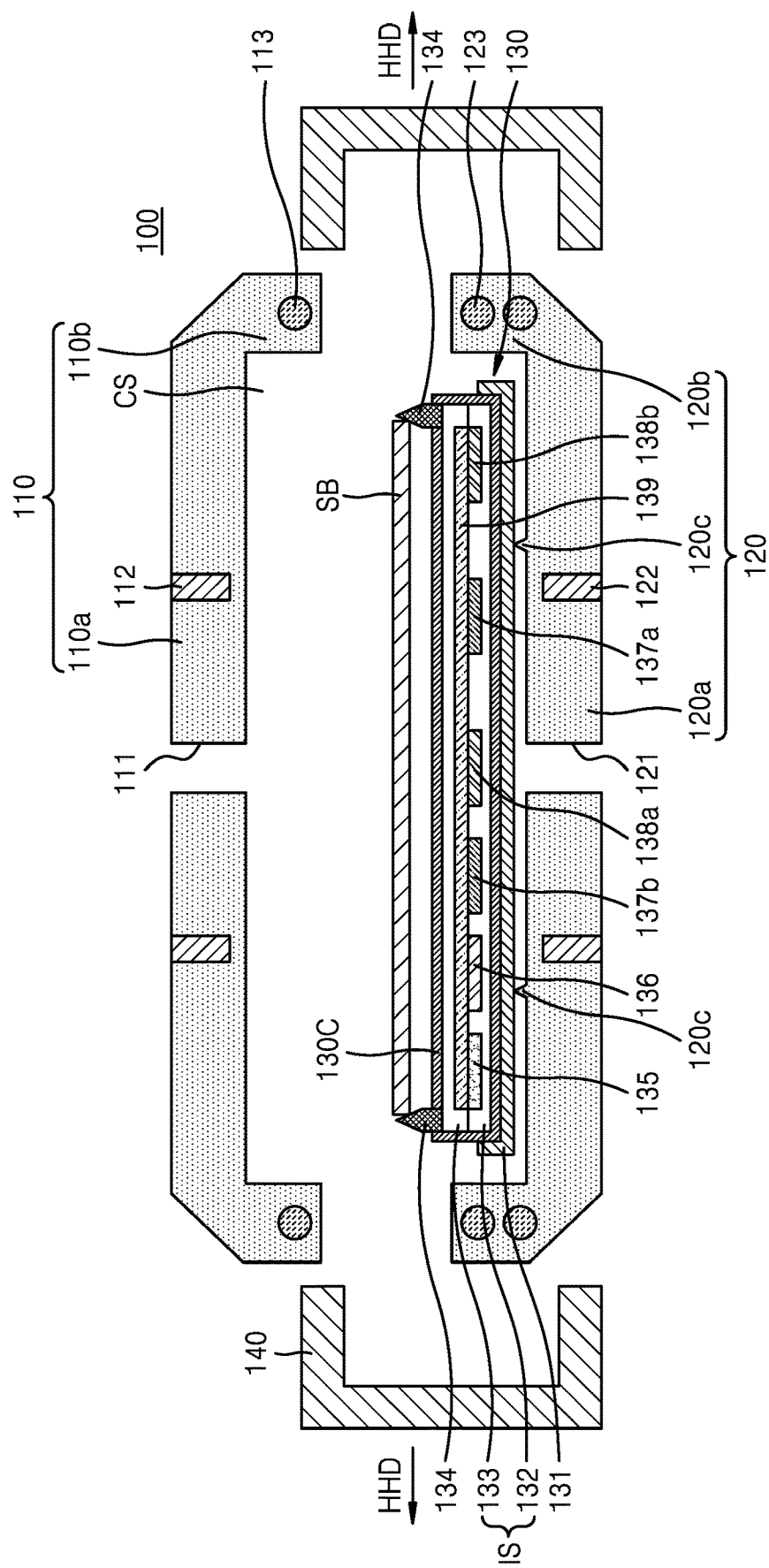

Next, referring to FIGS. 6 and 7G, the chamber space CS may be opened (S1470). For example, the plurality of coupling units 140 may be moved to a direction HHD away from the center of the substrate drying apparatus 100. In addition, the chamber space CS may be opened by separating the upper chamber body 110 from the lower chamber body 120. For example, the upper chamber body 110 may be moved away from the lower chamber body 120. Alternatively or additionally, the lower chamber body 120 may be moved away from the upper chamber body 110.

Figure 7H:
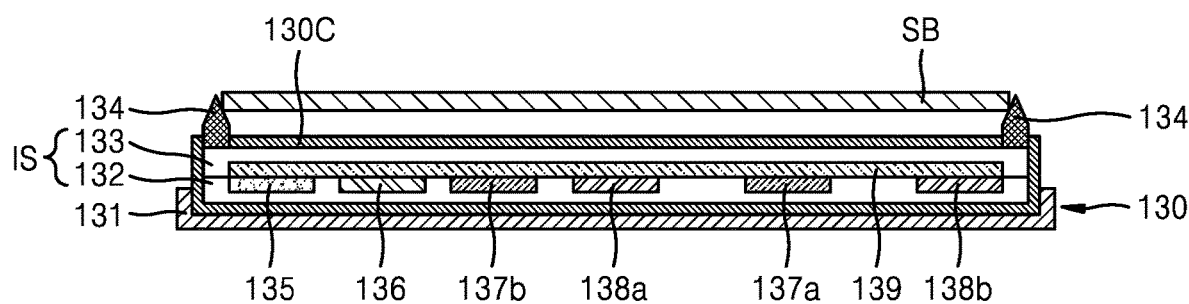

Next, referring to FIGS. 6, 7H, the stage 130 may be unloaded from the lower chamber body 120 (S1480). For example, the stage 130 may be unloaded from the pins 120c of the lower chamber body 120.

Figure 7I:
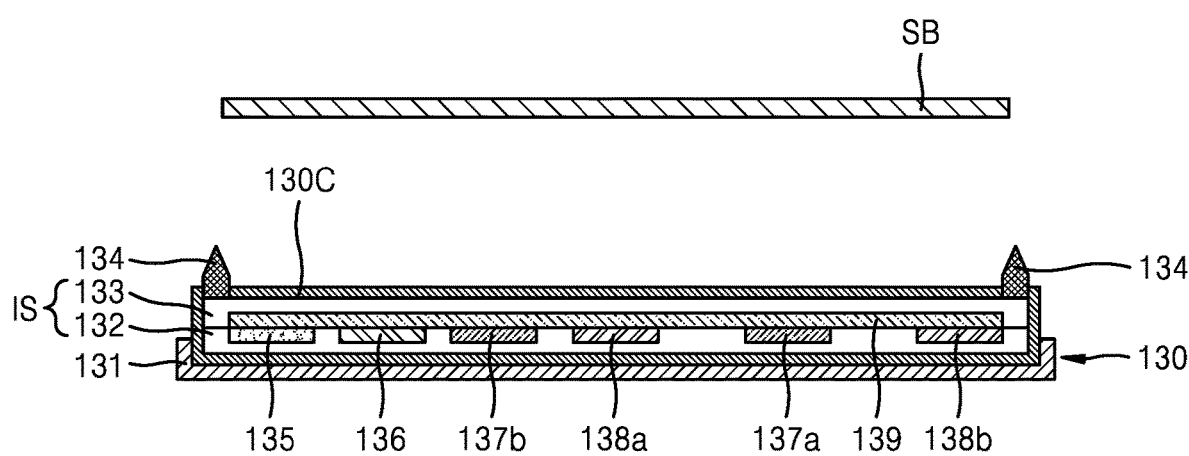

Next, referring to FIGS. 6 and 7I, the substrate SB may be unloaded from the stage 130 (S1490). For example, the substrate SB may be unloaded from the substrate pins 134 of the stage 130.

While the inventive concept has been particularly shown and described with reference to embodiments thereof, it will be understood that various changes in form and details may be made therein without departing from the spirit and scope of the following claims.

What is claimed is:

1. A substrate drying apparatus comprising:
an upper chamber body including an inlet configured to introduce a supercritical fluid into a chamber space;
a lower chamber body including an outlet configured to discharge the supercritical fluid outside the chamber space; and
a stage in the chamber space and configured to receive a wet substrate, wherein
the upper chamber body and the lower chamber body are configured such that the chamber space is closed by bringing the upper chamber body into contact with the lower chamber body, and the chamber space is opened by separating the upper chamber body from the lower chamber body, and
the stage comprises a heater in the stage configured to heat the substrate and the supercritical fluid.

2. The substrate drying apparatus of claim 1, wherein
the substrate drying apparatus is configured such that a pressure and a temperature in the chamber space is greater than or equal to a critical pressure and a critical temperature of the supercritical fluid, respectively.

3. The substrate drying apparatus of claim 1, wherein
the stage further comprises:
a battery supplying power to the heater; and
a wireless charging module for wirelessly charging the battery.

4. The substrate drying apparatus of claim 1, wherein
the stage further comprises:
a temperature sensor; and
a heater controller for controlling the heater according to the temperature sensor.

5. The substrate drying apparatus of claim 1, wherein
the heater includes a plurality of heating zones arranged in a first direction and a second direction, wherein the first direction and the second direction intersect each other, and
the stage further includes a heater controller which independently controls the plurality of heating zones.

6. The substrate drying apparatus of claim 1, wherein
the heater comprises a plurality of heating zones arranged in a radial direction of the heater, and
the stage further comprises a heater controller which independently controls the plurality of heating zones.

7. The substrate drying apparatus of claim 6, wherein
the heater controller controls a central heating zone and an outermost heating zone among the plurality of heating zones such that power consumed by the central heating zone is greater than power consumed by the outermost heating zone.

8. The substrate drying apparatus of claim 1, wherein
the lower chamber body comprises a floor and a lower wall extending from the floor toward the upper chamber body, and
the substrate drying apparatus further comprises a first lower heater in the floor and a second lower heater in the lower wall.

9. The substrate drying apparatus of claim 1, wherein
the upper chamber body comprises a ceiling and an upper wall extending from the ceiling toward the lower chamber body, and
the substrate drying apparatus further comprises a first upper heater in the ceiling and a second upper heater in the upper wall.

10. The substrate drying apparatus of claim 1, wherein
the lower chamber body comprises a floor and a lower wall extending from the floor toward the upper chamber body and forming a lower inclined portion;
the upper chamber body comprises a ceiling and an upper wall extending from the ceiling toward the lower chamber body and forming an upper inclined portion;
the substrate drying apparatus further comprising:
a plurality of coupling units configured to bring the upper chamber body into contact with the lower chamber body by contacting the lower inclined portion of the lower chamber body and the upper inclined portion of the upper chamber body.

11. The substrate drying apparatus of claim 1, wherein
the stage further comprises:
an insulating structure surrounding the heater; and
a coating layer surrounding the insulating structure, wherein
the coating layer comprises polytetrafluoroethylene (PTFE).

12. A substrate drying apparatus comprising:
an upper chamber body including an inlet configured to introduce a supercritical fluid into a chamber space;
a lower chamber body including an outlet configured to discharge the supercritical fluid outside the chamber space;
a plurality of coupling units configured to bring the upper chamber body into contact with the lower chamber body; and
a stage configured to be loaded with a wet substrate and arranged in the chamber space, wherein
the stage comprises:
an insulating structure;
a heater, a heater controller, a battery, and a wireless charging module in the insulating structure; and
a coating layer surrounding the insulating structure.

13. The substrate drying apparatus of claim 12, wherein
the substrate drying apparatus is configured such that a pressure and a temperature in the chamber space is greater than or equal to a critical pressure and a critical temperature of the supercritical fluid, respectively.

14. The substrate drying apparatus of claim 12, wherein
the stage further comprises:
a battery supplying power to the heater; and
a wireless charging module for wirelessly charging the battery.

15. The substrate drying apparatus of claim 12, wherein
the stage further comprises:
a temperature sensor; and
a heater controller for controlling the heater according to the temperature sensor.

16. The substrate drying apparatus of claim 12, wherein
the heater includes a plurality of heating zones arranged in a first direction and a second direction, wherein the first direction and the second direction intersect each other, and
the stage further includes a heater controller which independently controls the plurality of heating zones.

17. The substrate drying apparatus of claim 12, wherein
the heater comprises a plurality of heating zones arranged in a radial direction of the heater, and the stage further comprises a heater controller which independently controls the plurality of heating zones.

18. The substrate drying apparatus of claim 17, wherein the heater controller controls a central heating zone and an outermost heating zone among the plurality of heating zones such that power consumed by the central heating zone is greater than power consumed by the outermost heating zone.

19. The substrate drying apparatus of claim 12, wherein the lower chamber body comprises a floor and a lower wall extending from the floor toward the upper chamber body, and
the substrate drying apparatus further comprises a first lower heater in the floor and a second lower heater in the lower wall.

20. The substrate drying apparatus of claim 12, wherein the upper chamber body comprises a ceiling and an upper wall extending from the ceiling toward the lower chamber body, and
the substrate drying apparatus further comprises a first upper heater in the ceiling and a second upper heater in the upper wall.

* * * * *